United States Patent
Lidow et al.

(10) Patent No.: US 8,368,120 B2
(45) Date of Patent: Feb. 5, 2013

(54) HYBRID SEMICONDUCTOR DEVICE HAVING A GAN TRANSISTOR AND A SILICON MOSFET

(75) Inventors: Alexander Lidow, Hermosa Beach, CA (US); Daniel M. Kinzer, El Segundo, CA (US); Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/224,881

(22) Filed: Sep. 2, 2011

(65) Prior Publication Data

US 2012/0043553 A1    Feb. 23, 2012

Related U.S. Application Data

(63) Continuation of application No. 11/372,679, filed on Mar. 10, 2006, now Pat. No. 8,017,978.

(51) Int. Cl.
 *H01L 29/778* (2006.01)

(52) U.S. Cl. ........ 257/194; 257/195; 257/288; 257/401; 257/191; 257/192; 257/337; 257/338; 257/272; 257/341

(58) Field of Classification Search .............. 257/194, 257/195, 288, 401, 901, 191, 192, 337, 338, 257/272, 341
See application file for complete search history.

(56) References Cited

U.S. PATENT DOCUMENTS

| | | | |
|---|---|---|---|
| 5,567,961 A * | 10/1996 | Usagawa et al. | 257/197 |
| 6,768,146 B2 * | 7/2004 | Yoshida | 257/279 |
| 7,205,629 B2 * | 4/2007 | Singh | 257/492 |
| 7,719,055 B1 * | 5/2010 | McNutt et al. | 257/341 |
| 7,782,099 B2 * | 8/2010 | Kawamura | 327/108 |
| 2001/0024138 A1 * | 9/2001 | Dohnke et al. | 327/434 |
| 2002/0171405 A1 * | 11/2002 | Watanabe | 323/282 |
| 2006/0113971 A1 * | 6/2006 | Watanabe et al. | 323/265 |
| 2006/0145761 A1 * | 7/2006 | Pribble et al. | 330/251 |
| 2006/0175627 A1 * | 8/2006 | Shiraishi | 257/99 |
| 2006/0205112 A1 * | 9/2006 | Standing et al. | 438/106 |
| 2008/0315257 A1 * | 12/2008 | Shiraishi | 257/195 |

* cited by examiner

*Primary Examiner* — Marc Armand
*Assistant Examiner* — Bilkis Jahan
(74) *Attorney, Agent, or Firm* — Farjami & Farjami LLP

(57) ABSTRACT

A hybrid device including a silicon based MOSFET operatively connected with a GaN based device.

15 Claims, 1 Drawing Sheet

HYBRID SEMICONDUCTOR DEVICE HAVING A GAN TRANSISTOR AND A SILICON MOSFET

This is a continuation of application Ser. No. 11/372,679 filed Mar. 10, 2006 now U.S. Pat. No. 8,017,978.

FIELD OF INVENTION

The present invention relates power semiconductor device and more particularly to GaN based devices.

BACKGROUND OF THE INVENTION

Recent developments in electronic devices have created a demand for power devices that can supply higher currents. In addition to higher currents, it is important for power devices to operate more efficiently.

One way of obtaining efficiency is to operate the power device at higher frequencies. Conventional silicon based high voltage power switching devices such as 600V MOSFETs exhibit desirable high frequency switching characteristics. However, when conducting more than 5 A of current high voltage MOSFETS exhibit excessive power loss, and thus poor efficiency.

On the other hand low voltage power switching device can operate more efficiently at higher currents. The low breakdown voltage rating of low voltage power MOSFET is, however, a draw back.

To take advantage of the efficiency of a low voltage power MOSFET, the prior art has proposed combining a high band gap device with a low voltage device. For example, the prior art literature has proposed connecting a low voltage power MOSFET in a cascode arrangement with a high band gap device. According to the prior art concept, the high band gap device is selected to withstand a large portion of the reverse voltage, which allows for the selection of a low voltage power MOSFET.

A low voltage power MOSFET typically exhibits lower resistance during operation (Rdson) compared to a high voltage power MOSFET. High band gap devices, however, exhibit higher Rdson. The higher Rdson is due to the low carrier (electron) mobility of the high band gap material that comprises the high band gap device, which is usually higher than silicon. Thus, when a low voltage silicon based MOSFET is combined with a high band gap device, the advantageously low Rdson of the silicon-based MOSFET is sacrificed.

SUMMARY OF THE INVENTION

It is an object of the present invention to provide a hybrid power device having a low power loss during forward conduction and the ability to withstand high reverse voltage conditions.

A power device according to the present invention includes a silicon based power switching device such as a power MOSFET, and a high band gap device having an electron mobility at least equal to the power MOSFET such as a GaN based semiconductor device.

In a device according to the present invention the conduction path is arranged to pass through both devices so that under a reverse voltage condition the ability of both devices to withstand breakdown is combined. Thus, a power MOSFET of lower voltage rating may be combined with a GaN based device to obtain a hybrid device that exhibits low forward conduction loss and a high breakdown voltage rating. Advantageously, because GaN based devices can have as high an electron mobility as a silicon based device, a device according to the present invention does not suffer from the drawbacks of the prior art devices.

A device according to one embodiment of the present invention includes a power MOSFET operatively connected to a GaN based High Electron Mobility Transistor in a cascode arrangement. A GaN based High Electron Mobility Transistor can have at least as high an electron mobility as a silicon based MOSFET.

Alternatively, a GaN based WET may be used to form a hybrid device according to the present invention.

A device according to the present invention may be formed by copackaging a silicon based power MOSFET with a GaN based device, individually packaging each device and then connecting the two packages to one another, for example, on a common circuit board, or forming the two devices in a single die.

Other features and advantages of the present invention will become apparent from the following description of the invention which refers to the accompanying drawings.

DETAILED DESCRIPTION OF THE DRAWINGS

Figure 1:
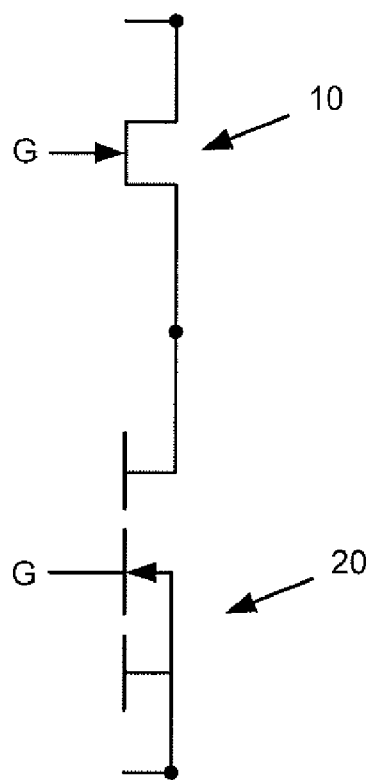
FIG. 1 shows a circuit diagram for a device according to the present invention.

Referring now to FIG. 1, a hybrid device according to the present invention includes a power semiconductor switching device, which may be silicon based power MOSFET 10, and GaN based device 20.

In a device according to the present invention, power MOSFET 10 is preferably connected with GaN based device 20 in a cascode configuration. That is, the drain electrode of power MOSFET 10 is connected with one of the electrodes of GaN based device 20 such that both devices will be in blocking mode under a reverse voltage condition. As a result, the capability of a device according to the present invention to withstand breakdown under reverse voltage conditions will be the combined capability of both devices. Thus, power MOSFET 10 and GaN based device 20 can be selected such that their combined breakdown voltage rating is equivalent to the breakdown voltage rating of a power semiconductor switching device of a higher rating. For example, a silicon based power MOSFET of a 200 V breakdown voltage rating can be connected with a GaN based device of a 400 V breakdown voltage rating in order to provide a combined 600 V breakdown voltage rating. Thus, a device according to the present invention may be used in lieu of a single 600 V silicon based power MOSFET. However, because a lower voltage MOSFET is used in a device according to the present invention the losses can be lowered.

GaN based device 20 may be an electronically controllable device, and thus may include a control electrode that is functionally similar to the gate electrode of power MOSFET 10. Preferably, power MOSFET 10 and GaN based device 20 are arranged such that they receive a control signal simultaneously so that current can travel through both devices without delay.

As referred to herein a GaN based device refers to a semiconductor device in which GaN is used to form a major part of its conductive path. GaN is suitable for a device according to the present invention because it is a high band gap material, and because, unlike other high band gap materials, it exhibits high electron mobility. In a device according to the present invention, the electron mobility of the GaN based device is preferably at least as high as the electron mobility of the silicon based device. Thus, advantageously, in a device according to the present invention Rdson is not sacrificed.

In one embodiment of the present invention, GaN based device 20 may be a High Electron Mobility Transistor (HEMT). A GaN based HEMT is a heterojunction device having a wide band gap.

Figure 2:
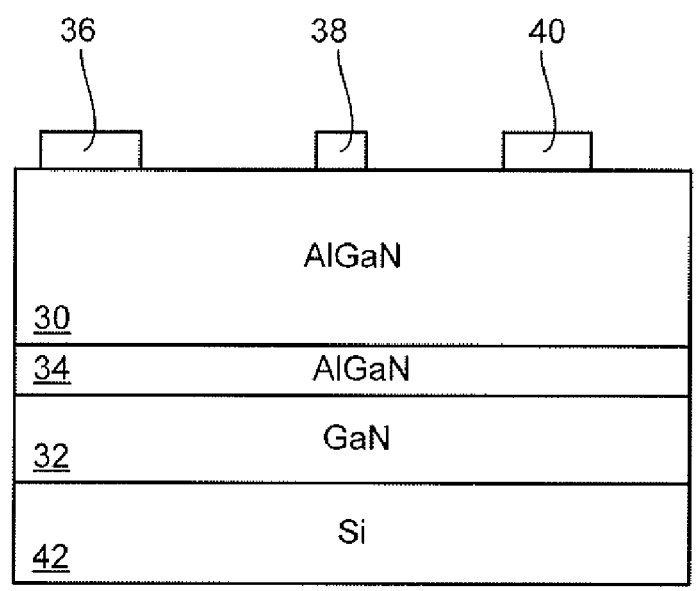
FIG. 2 shows a cross-sectional view of a portion of a GaN based power device according to prior art.

As shown by FIG. 2, a typical GaN based HEMT includes donor layer 30 disposed over GaN layer 32. Donor layer 30 may be comprised of AlGaN which is doped with silicon. Interposed between donor layer 30 and GaN layer 32 is an undoped AlGaN layer 34. Disposed on the top surface of Donor layer 30 are source contact 36, gate contact 38 and drain contact 40.

GaN layer 32 can be disposed over a conventional silicon substrate 42. As a result a GaN based HEMT can be economically produced.

Briefly, when operating, electrons travel from donor layer 30 to GaN layer 32 and form an electron gas. While in GaN layer 32 electrons experience higher mobility. As a result, a GaN based HEMT exhibits high electron mobility and the properties of a high band gap device.

A GaN based HEMT exhibits the ability to handle high power and high frequency switching. Further, a GaN based HEMT exhibits high current carrying capability, in addition to high breakdown voltage. Moreover, a GaN based HEMT exhibits high carrier mobility. Thus, when operated at a high frequency, a GaN based HEMT does not experience internal delays. That is, a GaN based HEMT exhibits good high frequency response. As a result, when combined with a silicon based MOSFET, a GaN based HEMT does not limit the operational frequency of a device according to the present invention.

In an alternative embodiment, a device according to the present invention may include a GaN based NET in combination with a silicon based MOSFET.

A device according to the present invention may be realize by copackaging silicon based power MOSFET 10 with GaN based device 20 in any desirable arrangement.

Alternatively, silicon based power MOSFET 10 and GaN based device 20 may be individually packaged and then connected to one another, for example, on a common circuit board.

As a further alternative embodiment, a hybrid device according to the present invention may include a power MOSFET 10 and a GaN based device formed in a single die.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A hybrid device comprising:
a silicon based power MOSFET in a common die;
a GaN based high electron mobility transistor situated in said common die and forming an operative connection to said silicon power MOSFET, wherein said silicon based power MOSFET and said GaN based high electron mobility transistor are arranged to receive a control signal substantially concurrently so that a common current can pass substantially concurrently through both said silicon based power MOSFET and said GaN based high electron mobility transistor.

2. The hybrid device of claim 1, wherein said operative connection is between a drain electrode of said silicon based power MOSFET and a source electrode of said GaN based high electron mobility transistor.

3. The hybrid device of claim 1, wherein said GaN based high electron mobility transistor is operatively connected in a cascode arrangement to said silicon based power MOSFET.

4. The hybrid device of claim 1, wherein a breakdown voltage of said hybrid device is equal to a sum of a breakdown voltage of said silicon based power MOSFET and a breakdown voltage of said GaN based high electron mobility transistor.

5. The hybrid device of claim 1, wherein said operative connection is between a drain electrode of said silicon based power MOSFET and a source electrode of said GaN based high electron mobility transistor, and wherein said operative connection does not comprise any other electrical connection.

6. A hybrid device comprising:
a silicon based power MOSFET;
a GaN based high electron mobility transistor not situated in a common die with said silicon based power MOSFET;
said GaN based high electron mobility being co-packaged with said silicon based power MOSFET and forming an operative connection to said silicon power MOSFET, wherein said silicon based power MOSFET and said GaN based high electron mobility transistor are arranged to receive a control signal substantially concurrently so that a common current can pass substantially concurrently through both said silicon based power MOSFET and said GaN based high electron mobility transistor.

7. The hybrid device of claim 6, wherein said operative connection is between a drain electrode of said silicon based power MOSFET and a source electrode of said GaN based high electron mobility transistor.

8. The hybrid device of claim 6, wherein said GaN based high electron mobility transistor is operatively connected in a cascode arrangement to said silicon based power MOSFET.

9. The hybrid device of claim 6, wherein a breakdown voltage of said hybrid device is equal to a sum of a breakdown voltage of said silicon based power MOSFET and a breakdown voltage of said GaN based high electron mobility transistor.

10. The hybrid device of claim 6, wherein said operative connection is between a drain electrode of said silicon based power MOSFET and a source electrode of said GaN based high electron mobility transistor, and wherein said operative connection does not comprise any other electrical connection.

11. A hybrid device comprising:
a silicon based power MOSFET in a first individual package;
a GaN based high electron mobility transistor in a second individual package;
said GaN based high electron mobility forming an operative connection to said silicon power MOSFET, wherein said silicon based power MOSFET and said GaN based high electron mobility transistor are arranged to receive a control signal substantially concurrently so that a common current can pass substantially concurrently through both said silicon based power MOSFET and said GaN based high electron mobility transistor.

12. The hybrid device of claim 11, wherein said operative connection is between a drain electrode of said silicon based power MOSFET and a source electrode of said GaN based high electron mobility transistor.

13. The hybrid device of claim 11, wherein said GaN based high electron mobility transistor is operatively connected in a cascode arrangement to said silicon based power MOSFET.

14. The hybrid device of claim 11, wherein a breakdown voltage of said hybrid device is equal to a sum of a breakdown voltage of said silicon based power MOSFET and a breakdown voltage of said GaN based high electron mobility transistor.

15. The hybrid device of claim 11, wherein said operative connection is between a drain electrode of said silicon based power MOSFET and a source electrode of said GaN based high electron mobility transistor, and wherein said operative connection does not comprise any other electrical connection.

* * * * *